US012666938B2

(12) United States Patent
Wang et al.

(10) Patent No.: US 12,666,938 B2
(45) Date of Patent: Jun. 23, 2026

(54) TSV STRUCTURE AND FABRICATING METHOD OF THE SAME

(71) Applicant: UNITED MICROELECTRONICS CORP., Hsin-Chu City (TW)

(72) Inventors: Hui-Lin Wang, Taipei City (TW); I-Fan Chang, Tainan City (TW); Jia-Rong Wu, Kaohsiung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 376 days.

(21) Appl. No.: 18/381,630

(22) Filed: Oct. 18, 2023

(65) Prior Publication Data

US 2025/0087559 A1 Mar. 13, 2025

(30) Foreign Application Priority Data

Sep. 7, 2023 (TW) ................................. 112134136

(51) Int. Cl.
| | |
|---|---|
| *H10W 20/20* | (2026.01) |
| *H10W 20/00* | (2026.01) |
| *H10W 20/41* | (2026.01) |
| *H10W 42/00* | (2026.01) |

(52) U.S. Cl.
CPC ......... *H10W 20/20* (2026.01); *H10W 20/023* (2026.01); *H10W 20/425* (2026.01); *H10W 42/00* (2026.01)

(58) Field of Classification Search
None
See application file for complete search history.

(56) References Cited

U.S. PATENT DOCUMENTS

| | | | |
|---|---|---|---|
| 8,362,599 B2 | 1/2013 | Kim | |
| 8,647,920 B2 | 2/2014 | Tezcan | |
| 8,779,559 B2 | 7/2014 | Ramachandran | |
| 2012/0080802 A1* | 4/2012 | Cheng | H01L 21/268 257/E21.597 |
| 2015/0329970 A1* | 11/2015 | Khan | H01L 21/68742 118/719 |
| 2022/0384312 A1* | 12/2022 | Wang | H01L 21/76898 |
| 2023/0024555 A1* | 1/2023 | Liu | H01L 23/367 |
| 2024/0222266 A1* | 7/2024 | Wang | H01L 21/76814 |

\* cited by examiner

*Primary Examiner* — Michelle Mandala
(74) *Attorney, Agent, or Firm* — Winston Hsu

(57) ABSTRACT

A TSV structure includes a substrate. A through via penetrates the substrate. A copper layer fills the through via. A trench is embedded in the substrate and surrounds the copper layer, and a material layer fills the trench. The material layer includes W, Cr, Ir, Re, Zr, SiOC glass, hydrogen-containing silicon oxynitride, silicon oxide or spin-on glass.

16 Claims, 6 Drawing Sheets

TSV STRUCTURE AND FABRICATING METHOD OF THE SAME

BACKGROUND OF THE INVENTION

1. Field of the Invention

The present invention relates to a through silicon via (TSV) structure, in particular to a structure that reduces stress around the TSV and a fabricating method thereof.

2. Description of the Prior Art

Making more reliable, lightweight, compact, fast, efficient and low-cost semiconductor products has always been an important goal of the electronics industry. With the development of highly integrated semiconductor products, the number of input/output pins has increased significantly. The technology of connecting semiconductor chips through TSV with small pitches has been widely developed. In this type of packaging structure, the connection between wafers is achieved through TSVs, which is a conductive through hole that penetrates the entire silicon wafer or chip to provide electrical connections.

However, due to the different thermal expansion coefficients between the conductive materials in the TSV and the substrate, the substrate and the TSV deform in different amounts when the temperature changes, causing stress in the substrate around the TSV, and the stress will affect the electron mobility of the transistor, and the performance of the transistor is will be deteriorated.

SUMMARY OF THE INVENTION

In view of this, the present invention provides a structure that reduces stress around TSV and a manufacturing method thereof to solve the above problems.

According to a preferred embodiment of the present invention, a TSV structure includes a substrate. A through via penetrates the substrate. A copper layer fills in the through via. A trench is embedded in the substrate and surrounds the copper layer. A material layer fills in the trench, wherein the material layer includes W, Cr, Ir, Re, Zr, SiOC glass, hydrogen-containing silicon oxynitride, silicon oxide or spin-on glass.

According to another preferred embodiment of the present invention, a TSV structure includes a substrate. A through via penetrates the substrate. A copper layer fills in the through via. Numerous holes are embedded in the substrate, wherein the holes are arranged into a pattern and the pattern surrounds the copper layer. Numerous material layers respectively fill in each of the holes, wherein each of the material layers includes W, Cr, Ir, Re, Zr, SiOC glass, hydrogen-containing silicon oxynitride, silicon oxide or spin-on glass.

According to yet another preferred embodiment of the present invention, a fabricating method of a TSV structure includes providing a substrate. Then, a trench is formed to be embedded in the substrate. Next, a copper layer is formed to be filled the trench. Subsequently, numerous holes are formed to be embedded in the substrate, wherein the holes are arranged into a pattern and the pattern surrounds the copper layer. Finally, material layers are formed to be respectively filled in each of the holes, wherein the material layers are hydrogen-containing silicon oxynitride and the material layers are formed by a flowable chemical vapor deposition.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 depict a method of fabricating a TSV structure according to a first preferred embodiment of the present invention, wherein:

FIG. 1 depicts a substrate with a material layer thereon; and

FIG. 2 is a fabricating stage in continuous of FIG. 1.

FIG. 4 to FIG. 5 depict a method of fabricating a TSV structure according to a second preferred embodiment of the present invention, wherein:

FIG. 4 depicts a substrate with a material layer thereon; and

FIG. 5 is a fabricating stage in continuous of FIG. 4.

FIG. 7 depicts a substrate with a material layer thereon;

FIG. 8 is a fabricating stage in continuous of FIG. 7.

DETAILED DESCRIPTION

Figure 1:
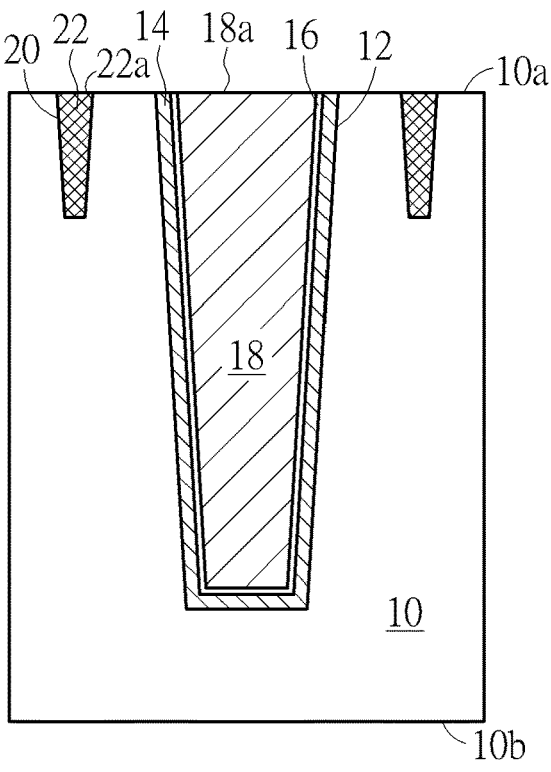
Figure 2:
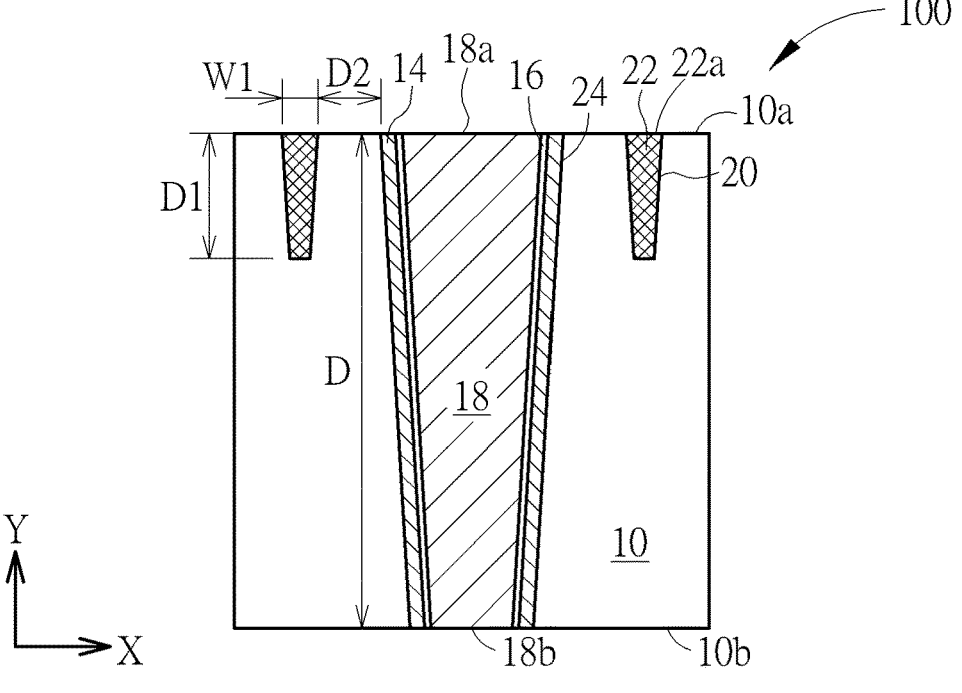
Figure 3:
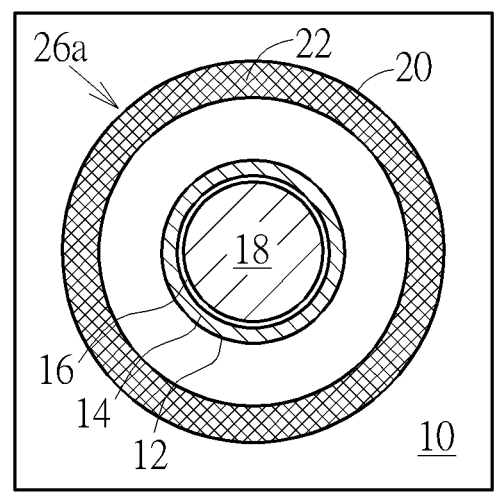
FIG. 3 depicts s a top view of a TSV structure in the first preferred embodiment.
Figure 3:
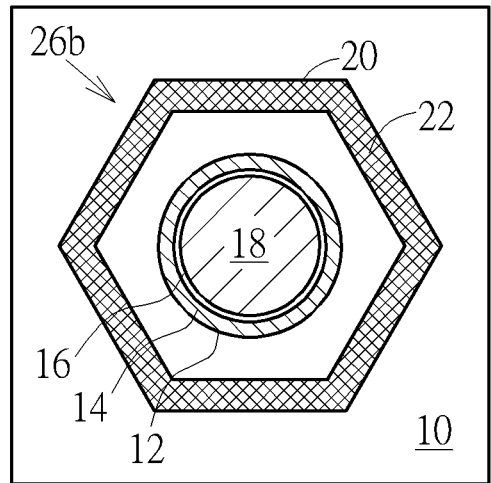
Figure 3:
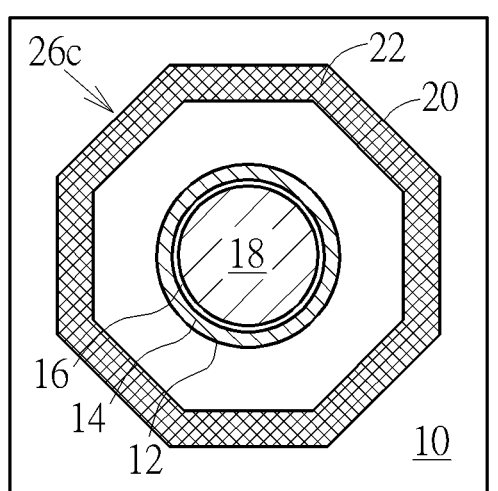
Figure 3:
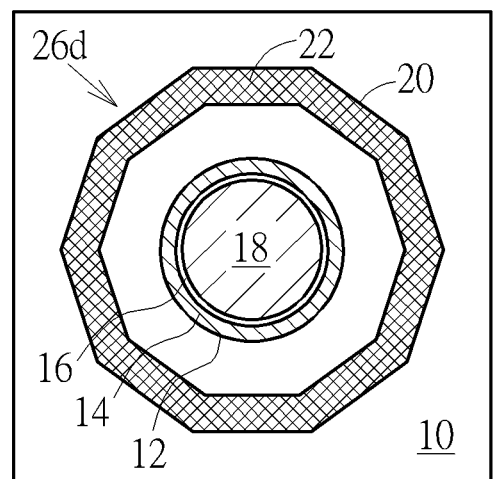
Figure 3:
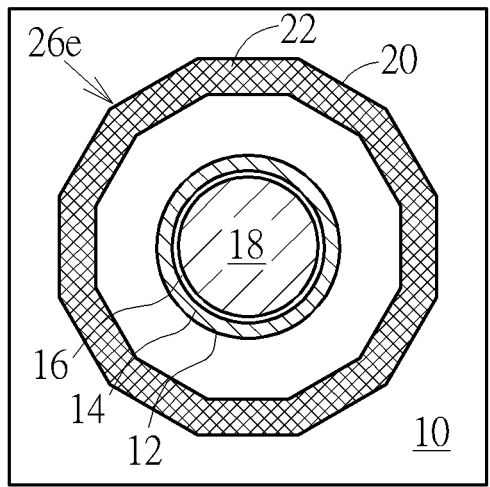

FIG. 1 to FIG. 2 depict a method of fabricating a TSV structure according to a first preferred embodiment of the present invention. FIG. 3 depicts s a top view of a TSV structure in the first preferred embodiment.

As shown in FIG. 1, a substrate 10 is provided. The substrate 10 includes a silicon substrate, a germanium substrate, a gallium arsenide substrate, a silicon germanium substrate, an indium phosphide substrate, a gallium nitride substrate, a silicon carbide substrate or a silicon on insulator substrate. The substrate 10 includes a front side 10a and a back side 10b. Then, the substrate 10 is etched from the front side 10a to form a trench 12 in the substrate 10. Next, a silicon oxide layer 14 is formed to cover the sidewalls and the bottom of the trench 12 and the front side 10a of the substrate 10. Afterwards, a barrier 16 is formed to conformally cover the silicon oxide layer 14. Then, a copper layer 18 is formed to fill in the trench 12 and cover the front surface 10a of the substrate 10. The silicon oxide layer 14, the barrier 16 and the copper layer 18 can be formed by a physical vapor deposition, a chemical vapor deposition, an atomic layer deposition or an electroplating process. Subsequently, a polishing process is performed to remove the copper layer 18, the barrier 16 and the silicon oxide layer 14 outside the trench 12 to make the top surface of the remaining silicon oxide layer 14 and the top surface of the remaining copper layer 18 aligned with the front surface 10a of the substrate 10. The barrier 16 includes Ti, Ta, TiN or TaN.

Later, a trench 20 is formed at outside of the trench 12 to surround the trench 12. Then, a material layer 22 is formed to fill in the trench 20. The material layer 22 includes W, Cr, Ir, Re, Zr, SiOC glass, hydrogen-containing silicon oxynitride, silicon oxide or spin-on glass. The fabricating process of filling the trench 20 with the material layer 22 can be performed by using a flowable chemical vapor deposition, a physical vapor deposition, a chemical vapor deposition or an atomic layer deposition. Taking the material layer 22 as silicon oxynitride containing hydrogen as an example, the material layer 22 can be formed by using a flowable chemical vapor deposition to fill the trench 20. Steps of the flowable chemical vapor deposition includes depositing the material layer 22 by inputting precursors including trisilylamine (TSA), ammonia (NH3) and oxygen at a temperature of 65° C. Then, the material layer 22 is solidified at 105° C. The advantage of the flowable chemical vapor deposition is that because the material layer 22 during the initial deposition is fluid, and the fluid can fill in the trench 20 more completely.

After that, a polishing process is performed to remove the material layer 22 outside the trench 20, so as to make the top surface 22a of the remaining material layer 22 aligned with the front surface 10a of the substrate 10. As shown in FIG. 2, the back surface 10b of the substrate 10 is polished until the copper layer 18 is exposed. At this time, the trench 12 becomes a through via 24, and the bottom surface 18b of the copper layer 18 is aligned with the back surface 10b of the substrate 10. At this point, a TSV structure 100 of the present invention is completed.

As shown in FIG. 2, a TSV structure 100 of the present invention includes a substrate 10. A through via 24 penetrates the substrate 10, and a copper layer 18 fills the through via 24. A trench 22 is embedded in the substrate 10 and surrounds the copper layer 18. A material layer 22 fills in the trench 20. The material layer 22 includes W, Cr, Ir, Re, Zr, SiOC glass, hydrogen-containing silicon oxynitride, silicon oxide or spin-on glass. The material layer 22 may also be other material with a thermal expansion coefficient greater than the thermal expansion coefficient of silicon and less than the thermal expansion coefficient of copper. A silicon oxide layer 14 and a barrier 16 are disposed between the copper layer 18 and the through via 24. The silicon oxide layer 14 contacts the sidewalls of the through via 24. The barrier 16 contacts the silicon oxide layer 14 and the copper layer 18. The top surface 22a of the material layer 22, the top surface 18a of the copper layer 18 and the front surface 10a of the substrate 10 are aligned. A first direction Y is perpendicular to a front surface 10a of the substrate 10, and a second direction X is parallel to the front surface 10a of the substrate 10. Along the first direction Y, a depth D1 of the trench 20 is 0.5 to 5% of a depth D of the through via 24. According to a preferred embodiment of the present invention, the depth D1 of the trench 20 is between 0.25 micrometers and 2 micrometers. Since the channel region of a transistor formed afterwards will be disposed close to the front surface 10a of the substrate 10, the trench 20 does not need to be as deep as the through via 24. The depth D1 of the trench 20 only needs to be deep enough to overlap the channel region of the transistor. Therefore, the depth D1 of the trench 20 will be smaller than the depth D of the through via 24. Along the second direction X, a width W1 of the trench 20 is between 0.05 micrometers and 2 micrometers. Moreover, along the second direction X, a shortest distance D2 between the through via 24 and the trench 20 is between 0.5 micrometers and 2 micrometers.

Please refer to FIG. 2 and FIG. 3. According to different requirements, the trench 20 can form different patterns 26a/26b/26c/26d/26e. For example, when viewing from the top view, the pattern 26a is a closed circular ring. The pattern 26b is a closed hexagonal ring. The pattern 26c is a closed octagonal ring. The pattern 26d is a closed decagonal ring.

The pattern 26e is a closed dodecagonal ring. According to different requirements, the pattern can be a closed polygonal ring of other shapes, but the number of corners of the polygonal ring must be greater than 6 and an even number.

Figure 4:
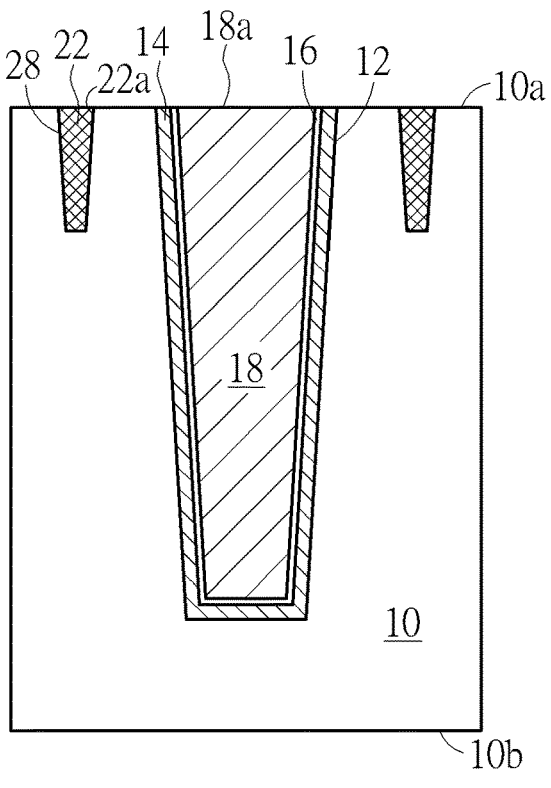
Figure 5:
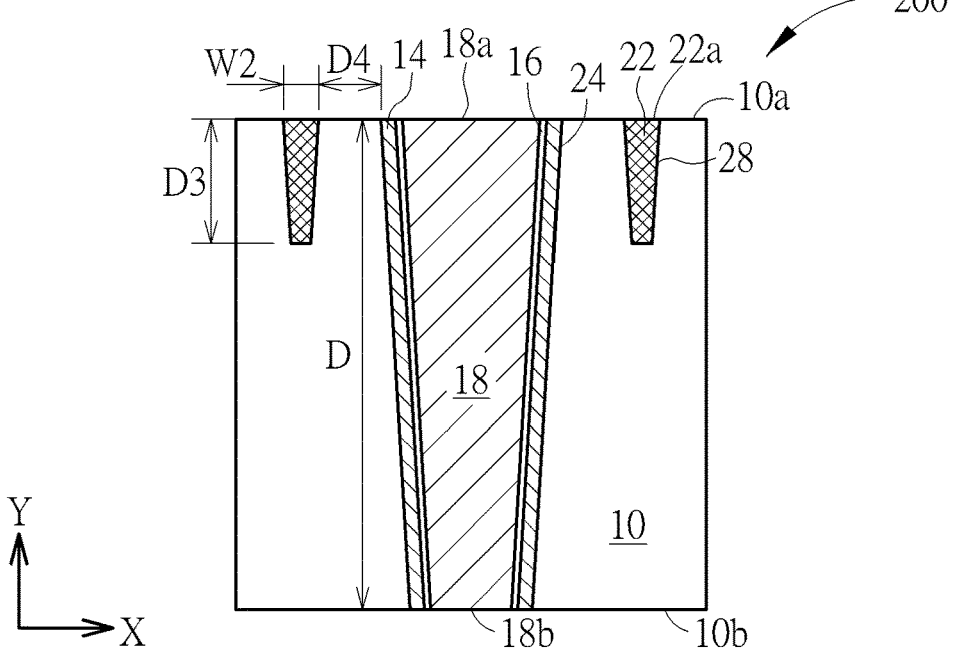
Figure 6:
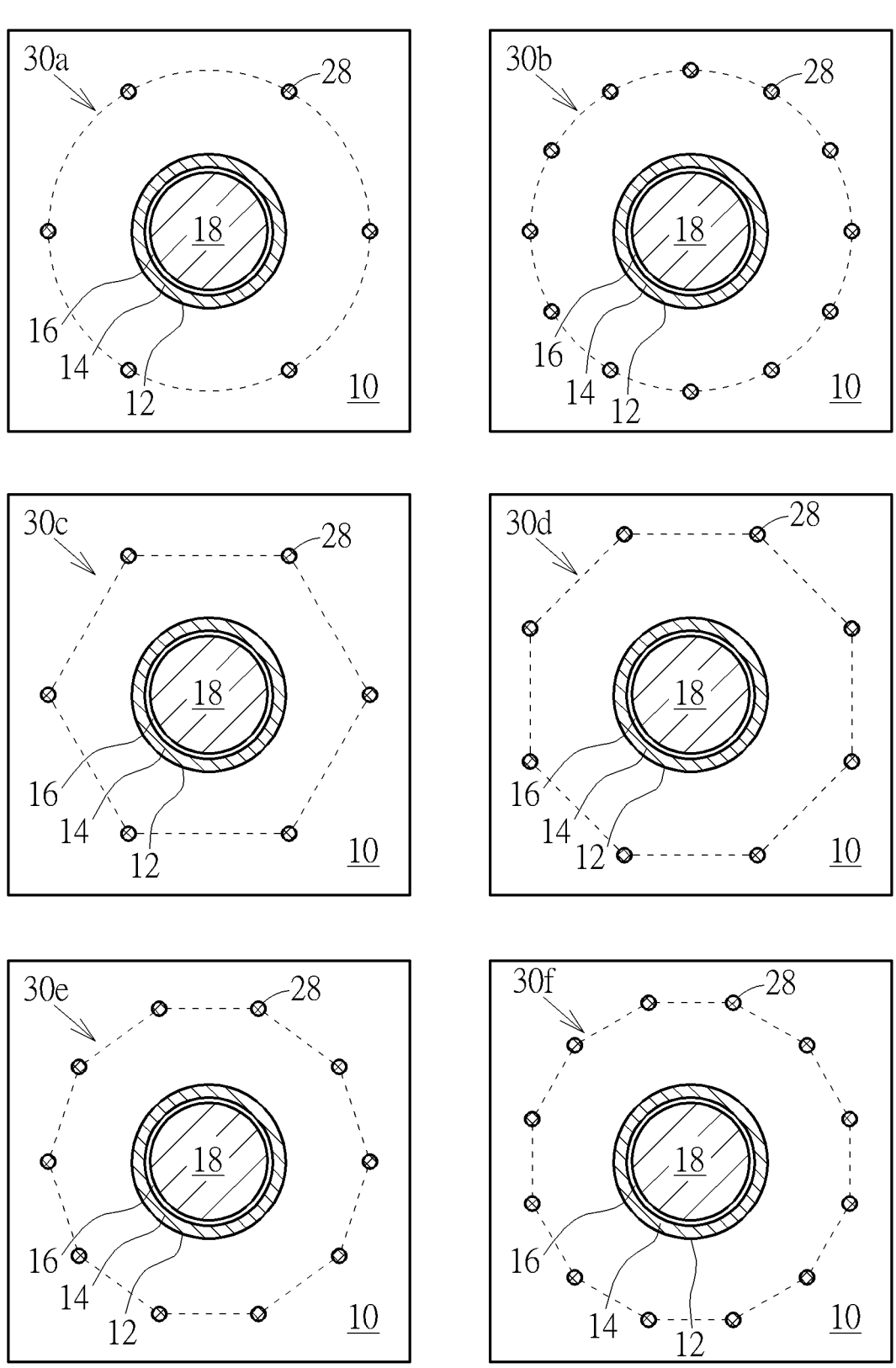
FIG. 6 depicts a top view of a TSV structure in the second preferred embodiment.

FIG. 4 to FIG. 5 depict a method of fabricating a TSV structure according to a second preferred embodiment of the present invention. FIG. 6 depicts a top view of a TSV structure in the second preferred embodiment, wherein elements which are substantially the same as those in the first preferred embodiment are denoted by the same reference numerals; an accompanying explanation is therefore omitted.

Please refer to FIGS. 4 and 6. The difference between the first preferred embodiment and the second preferred embodiment is that in the second preferred embodiment, after the polishing process is used to remove the silicon oxide layer 14, the barrier 16 and the copper layer 18 outside the trench 12, instead of forming a trench, a plurality of holes 28 are formed to surround the trench 12. After that, material layers 22 are respectively formed to fill in each of the holes 28. Each of the material layers 22 includes W, Cr, Ir, Re, Zr, SiOC glass, hydrogen-containing silicon oxynitride, silicon oxide or spin-on glass. The fabricating process of filling the holes 28 with the material layers 22 can be performed by using a flowable chemical vapor deposition, a physical vapor deposition, a chemical vapor deposition or an atomic layer deposition. Taking the material layers 22 as silicon oxynitride containing hydrogen as an example, the material layers 22 can be formed by using a flowable chemical vapor deposition. Steps of the flowable chemical vapor deposition includes depositing the material layers 22 by inputting precursors including trisilylamine (TSA), ammonia (NH3) and oxygen at a temperature of 65° C. Then, the material layers 22 are solidified at 105° C. The advantage of the flowable chemical vapor deposition is that because the material layers 22 during the initial deposition is fluid, and the fluid can fill the holes 28 more completely.

After that, a polishing process is performed to remove the material layers 22 outside the holes 28, so as to make the top surfaces 22a of the remaining material layers 22 aligned with the front surface 10a of the substrate 10. As shown in FIG. 5, the back surface 10b of the substrate 10 is polished until the copper layer 18 is exposed. At this time, the trench 12 becomes a through via 24, and the bottom surface 18b of the copper layer 18 is aligned with the back surface 10b of the substrate 10. At this point, a TSV structure 200 of the present invention is completed.

As shown in FIG. 5, a TSV structure 200 of the present invention includes a substrate 10. A through via 24 penetrates the substrate 10, and a copper layer 18 fills the through via 24. A silicon oxide layer 14 and a barrier 16 are disposed between the copper layer 18 and the through via 24. The silicon oxide layer 14 contacts the sidewall of the through via 24. The barrier 16 contacts the silicon oxide layer 14 and the copper layer 18. Numerous holes 28 are embedded in the substrate 10. Material layers 22 respectively fill in each of the holes 28. Each of the material layers 22 respectively includes W, Cr, Ir, Re, Zr, SiOC glass, hydrogen-containing silicon oxynitride, silicon oxide or spin-on glass. The material layers 22 may also be other material with a thermal expansion coefficient greater than the thermal expansion coefficient of silicon and less than the thermal expansion coefficient of copper. The top surface 22a of the material layers 22, the top surface 18a of the copper layer 18 and the front surface 10a of the substrate 10 are aligned. A first direction Y is perpendicular to a front surface 10a of the substrate 10, and a second direction X is parallel to the front surface 10a of the substrate 10. Along the first direction Y, a depth D3 of each of the holes 28 is 0.5 to 5% of a depth D of the through via 24. According to a preferred embodiment of the present invention, the depth D3 of each of the holes 28 is between 0.25 micrometers and 2 micrometers. Since the channel region of a transistor formed afterwards will be disposed close to the front surface 10a of the substrate 10, the holes 28 do not need to be as deep as the through via 24. The depth D3 only needs to be deep enough to overlap the channel region of the transistor. Therefore, the depth D3 of each of the holes 28 will be smaller than the depth D of the through via 24. Along the second direction X, a diameter W2 of each of the holes 28 is between 0.05 micrometers and 2 micrometers. Moreover, along the second direction X, a shortest distance D4 between the through via 24 and each of the holes 28 is between 0.5 micrometers and 2 micrometers.

As shown in FIG. 6, all the holes 28 are arranged into patterns 30a/30b/30c/30d/30e/30f. Patterns 30a/30b/30c/30d/30e/30f surrounds the copper layer 18. The number of holes 28 can be changed according to different requirements, but the number of holes 28 is preferably greater than 6 and is an even number. For example, the pattern 30a is a closed ring formed by 6 holes 28, and pattern 30b is a closed ring formed by 12 holes 28. Patterns 30c/30d/30e/30f can be a closed polygonal ring. The number of corners of the polygonal ring can be changed according to different needs, but the number of corners should preferably be greater than 6 and an even number. For instance, the pattern 30c is a closed hexagonal ring, the pattern 30d is a closed octagonal ring, the pattern 30e is a closed decagonal ring, and the pattern 30f is a closed dodecagonal ring. Each hole 28 is located at the corner of the polygonal ring. The polygonal ring is seen by connecting the holes 28 with dotted lines. The dotted lines in FIG. 6 are only to illustrate the shape of the closed polygonal ring and do not actually exist on the substrate 10. The number of holes 28 in the patterns 30c/30d/30e/30f can also be changed and is not limited to the number shown in the figure. Similarly, the number of holes 28 is preferably more than 6 and is an even number.

Figure 7:
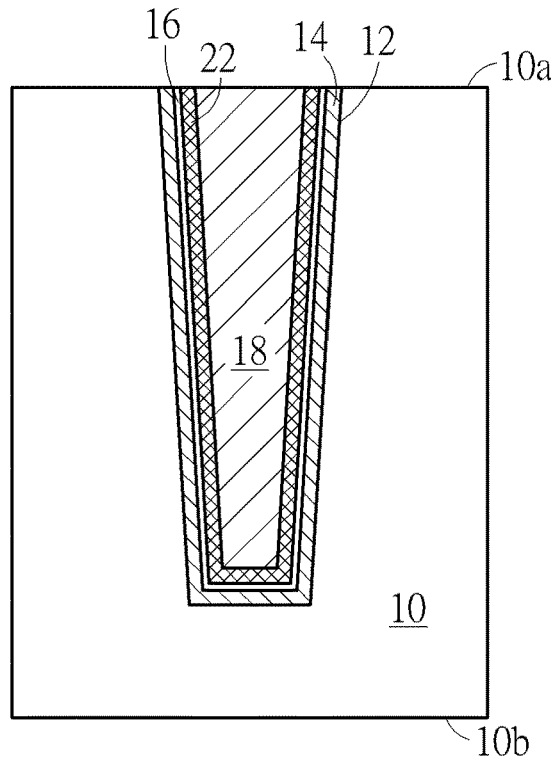
FIG. 7 to FIG. 8 depict a method of fabricating a TSV structure according to a third preferred embodiment of the present invention.
Figure 8:
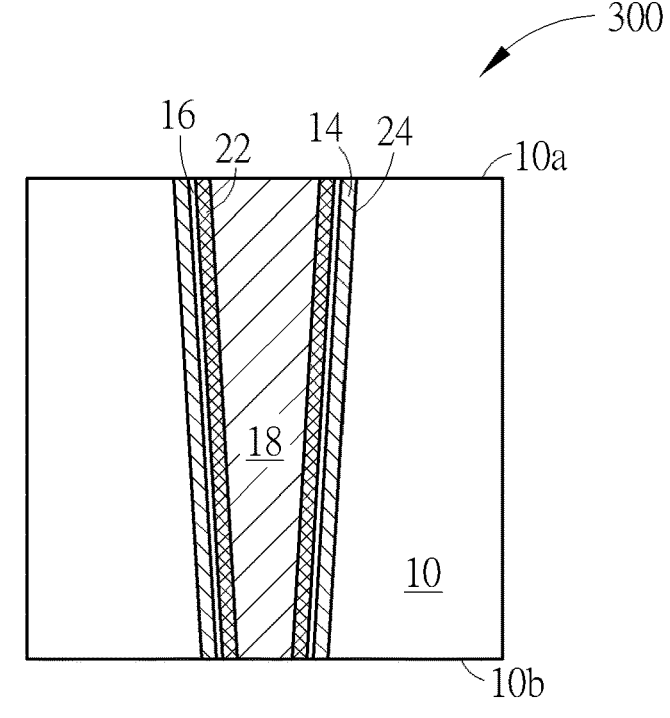

FIG. 7 to FIG. 8 depict a method of fabricating a TSV structure according to a third preferred embodiment of the present invention, wherein elements which are substantially the same as those in the first preferred embodiment are denoted by the same reference numerals; an accompanying explanation is therefore omitted.

As shown in FIG. 7, a substrate 10 is provided. The substrate 10 includes a front side 10a and a back side 10b. Then, the substrate 10 is etched from the front side 10a of the substrate 10 to form a trench 12 in the substrate 10. A silicon oxide layer 14, a barrier 16 and a material layer 22 are sequentially formed to cover the sidewalls and bottom of the trench 12 and the front surface 10a of the substrate 10. Then, a copper layer 18 is formed to fill in the trench 12. The material layer 22 includes W, Cr, Ir, Re, Zr, SiOC glass, hydrogen-containing silicon oxynitride, silicon oxide or spin-on glass.

The material layer 22 can be formed by a physical vapor deposition, a chemical vapor deposition, an atomic layer deposition or an electroplating process. Subsequently, a polishing process is performed to remove the copper layer 18, the barrier 16 and the silicon oxide layer 14 outside the trench 12.

As shown in FIG. 8, the back surface 10b of the substrate 10 is polished until the copper layer 18 is exposed. At this time, the trench 12 becomes a through via 24. At this point, a TSV structure 300 of the present invention is completed.

The difference between the first preferred embodiment, the second preferred embodiment and the third preferred embodiment is that in the third preferred embodiment, no trenches or holes are formed around the copper layer 18. Because in the third preferred embodiment, the material layer 22 is directly disposed in the trench 12 and the material layer 22 contacts the copper layer 18.

The TSV structure 300 includes a substrate 10. A through via 24 penetrates the substrate 10. A silicon oxide layer 14 covers and contacts the sidewall of the through via 24. A copper layer 18 fills in the through via 24. A barrier 16 and a material layer 22 are located between the copper layer 18 and the silicon oxide layer 14. The barrier 16 contacts the silicon oxide layer 14, and the material layer 22 contacts the copper layer 18. Therefore, the silicon oxide layer 14, the barrier 16, the material layer 22 and the copper layer 18 are arranged in sequence from close to the sidewall of the through via 24 to far away from the sidewall of the through via 24. Because the material layer 22 is disposed in the through via 24, the aforementioned shortest distances D2/D4 is not needed in this embodiment, so the size of the TSV structure can be further reduced.

Figure 9:
FIG. 9 depicts a TSV structure according to a fourth preferred embodiment of the present invention.
Figure 9:
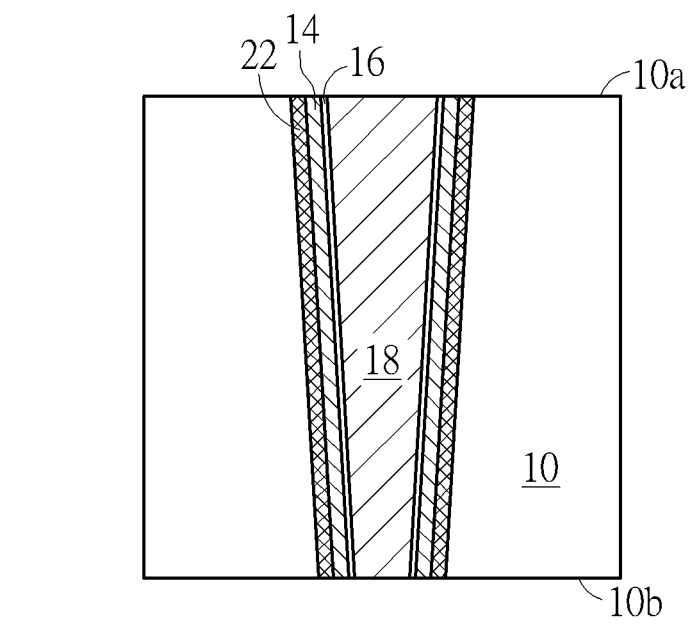

FIG. 9 depicts a TSV structure according to a fourth preferred embodiment of the present invention. The difference between the TSV structure 400 in the fourth preferred embodiment and the TSV structure 300 in the third preferred embodiment is that the material layer 22 in the TSV structure 400 contacts the sidewall of the through via 24. That is, the material layer 22, the silicon oxide layer 14, the barrier 16 and the copper layer 18 are arranged in sequence from close to the sidewall of the through via 24 to far away from the sidewall of the through via 24.

Because the thermal expansion coefficients of copper and silicon substrate in the TSV structure are greatly different, when temperature changes, copper and the silicon substrate will expand in different volumes, which will cause stress variation in the substrate around the TSV. In order to prevent the performance of the transistor from being affected, the transistor needs to be disposed at least 20 micrometers away from the TSV, which will increase the size of the chip. Therefore, in the present invention, a material layer is formed around the TSV, and the material layer is with a thermal expansion coefficient between the thermal expansion coefficient of copper and the thermal expansion coefficient of silicon. In this way, the difference in volume expansion between copper and silicon can be decreased, and range that influenced by stress variation can be reduced. Therefore, by adding the material layer, the distance between the transistor and the TSV structure can be reduced, and the size of the chip also becomes smaller.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through silicon via (TSV) structure, comprising:
   a substrate;
   a through via penetrating the substrate;
   a copper layer filling in the through via;
   a trench embedded in the substrate and surrounding the copper layer, wherein the trench is separated from the through via by a portion of the substrate, and the portion of the substrate is free of an epitaxial layer, and wherein a first direction is perpendicular to a front surface of the substrate, and along the first direction, a depth of the trench measured from the front surface of the substrate is 0.5 to 5% of a depth of the through via measured from the front surface of the substrate; and a material layer filling in the trench, wherein the material layer comprises W, Cr, Ir, Re, Zr, SiOC glass, hydrogen-containing silicon oxynitride, silicon oxide or spin-on glass.

2. The TSV structure of claim 1, wherein the trench forms a pattern, the pattern comprises a closed circular ring, a closed hexagonal ring, a closed octagonal ring, a closed decagonal ring or a closed dodecagonal ring.

3. The TSV structure of claim 1, wherein a second direction is parallel to the front surface of the substrate, along the first direction, the depth of the trench is between 0.25 micrometers and 2 micrometers, and along the second direction, a width of the trench is between 0.05 micrometers and 2 micrometers.

4. The TSV structure of claim 1, wherein a second direction is parallel to the front surface of the substrate, and along the second direction, a shortest distance between the through via and the trench is between 0.5 micrometers and 2 micrometers.

5. The TSV structure of claim 1, further comprising a silicon oxide layer and a barrier disposed between the copper layer and the through via.

6. The TSV structure of claim 1, wherein a top surface of the material layer, a top surface of the copper layer and a front surface of the substrate are aligned.

7. The TSV structure of claim 1, wherein a bottom surface of the copper layer is aligned with a back surface of the substrate.

8. A through silicon via (TSV) structure, comprising:
a substrate;
a through via penetrating the substrate;
a copper layer filling in the through via;
a plurality of holes embedded in the substrate, wherein the plurality of holes are arranged into a pattern and the pattern surrounds the copper layer, wherein each of the plurality of holes is separated from the through via by a portion of the substrate, and the portion of the substrate is free of an epitaxial layer, and wherein a first direction is perpendicular to a front surface of the substrate, and along the first direction, a depth of each of the plurality of holes measured from the front surface of the substrate is 0.5 to 5% of a depth of the through via measured from the front surface of the substrate; and
a plurality of material layers respectively filling in each of the plurality of holes, wherein each of the plurality of material layers comprises W, Cr, Ir, Re, Zr, SiOC glass, hydrogen-containing silicon oxynitride, silicon oxide or spin-on glass.

9. The TSV structure of claim 8, wherein the pattern comprises a closed circular ring, a closed hexagonal ring, a closed octagonal ring, a closed decagonal ring or a closed dodecagonal ring.

10. The TSV structure of claim 8, wherein a second direction is parallel to the front surface of the substrate, along the first direction, the depth of each of the plurality of holes is between 0.25 micrometers and 2 micrometers, and along the second direction, a diameter of each of the plurality of holes is between 0.05 micrometers and 2 micrometers.

11. The TSV structure of claim 8, a second direction is parallel to the front surface of the substrate, and along the second direction, a shortest distance between the through via and each of the plurality of holes is between 0.5 micrometers and 2 micrometers.

12. The TSV structure of claim 8, further comprising a silicon oxide layer and a barrier disposed between the copper layer and the through via.

13. The TSV structure of claim 8, wherein a top surface of the material layer, a top surface of the copper layer and a front surface of the substrate are aligned.

14. The TSV structure of claim 8, wherein a bottom surface of the copper layer is aligned with a back surface of the substrate.

15. A fabricating method of a through silicon via (TSV) structure, comprising:
providing a substrate;
forming a trench embedded in the substrate;
forming a copper layer filling in the trench;
forming a plurality of holes embedded in the substrate, wherein the plurality of holes are arranged into a pattern and the pattern surrounds the copper layer;
forming a plurality of material layers respectively filling in each of the plurality of holes, wherein the plurality of the material layers are hydrogen-containing silicon oxynitride and the plurality of the material layers are formed by a flowable chemical vapor deposition; and
polishing a back surface of the substrate to expose the copper layer and to thin the trench, wherein the trench which is thinned becomes a through via, each of the plurality of holes is separated from the through via by a portion of the substrate, and the portion of the substrate is free of an epitaxial layer, and wherein a first direction is perpendicular to a front surface of the substrate, and along the first direction, a depth of each of the plurality of holes measured from the front surface of the substrate is 0.5 to 5% of a depth of the through via measured from the front surface of the substrate.

16. The fabricating method of a TSV structure of claim 15, wherein steps of the flowable chemical vapor deposition comprise:
depositing the plurality of the material layers by inputting precursors including trisilylamine (TSA), ammonia ($NH_3$) and oxygen at a temperature of 65° C.; and
solidifying the plurality of the material layers at 105° C.

* * * * *